(12) United States Patent
Goodman et al.

(10) Patent No.: US 7,648,579 B2
(45) Date of Patent: Jan. 19, 2010

(54) SUBSTRATE SUPPORT SYSTEM FOR REDUCED AUTODOPING AND BACKSIDE DEPOSITION

(75) Inventors: Matt G. Goodman, Chandler, AZ (US); Jereon Stoutyesdijk, Scottsdale, AZ (US); Ravinder Aggarwal, Gilbert, AZ (US); Mike Halpin, Scottsdale, AZ (US); Tony Keeton, Mesa, AZ (US); Mark Hawkins, Gilbert, AZ (US); Lee Haen, Phoenix, AZ (US); Armand Ferro, Phoenix, AZ (US); Paul Brabant, Phoenix, AZ (US); Robert Vyne, Gilbert, AZ (US); Gregory M. Bartlett, Chandler, AZ (US); Joseph P. Italiano, Phoenix, AZ (US); Bob Haro, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 320 days.

(21) Appl. No.: 11/057,111

(22) Filed: Feb. 11, 2005

(65) Prior Publication Data

US 2005/0193952 A1 Sep. 8, 2005

Related U.S. Application Data

(60) Provisional application No. 60/591,258, filed on Jul. 26, 2004, provisional application No. 60/545,181, filed on Feb. 13, 2004.

(51) Int. Cl.
*C23C 16/458* (2006.01)
*C23C 16/00* (2006.01)
*H01L 21/306* (2006.01)

(52) U.S. Cl. .................. 118/730; 118/715; 118/725; 118/728; 118/500; 156/345.33; 156/345.51; 156/345.52; 156/345.54

(58) Field of Classification Search ............ 156/345.51, 156/345.52, 345.53, 345.33, 345.34, 345.54; 118/715, 725, 728, 730, 500
See application file for complete search history.

(56) References Cited

U.S. PATENT DOCUMENTS 4,232,063 A 11/1980 Rosler et al.

(Continued)

FOREIGN PATENT DOCUMENTS

EP 1 137 042 A 9/2001

(Continued)

OTHER PUBLICATIONS

Schunk Group, "Datasheet C-SiC for semiconductor applications," Schunck Semiconductor, Mar. 2005, 1 page.

*Primary Examiner*—Jeffrie R Lund
*Assistant Examiner*—Satish Chandra
(74) *Attorney, Agent, or Firm*—Knobbe, Martens, Olson & Bear, LLP

(57) ABSTRACT

A substrate support system comprises a substrate holder having a plurality of passages extending between top and bottom surfaces thereof. The substrate holder supports a peripheral portion of the substrate backside so that a thin gap is formed between the substrate and the substrate holder. A hollow support member provides support to an underside of, and is configured to convey gas upward into one or more of the passages of, the substrate holder. The upwardly conveyed gas flows into the gap between the substrate and the substrate holder. Depending upon the embodiment, the gas then flows either outward and upward around the substrate edge (to inhibit backside deposition of reactant gases above the substrate) or downward through passages of the substrate holder, if any, that do not lead back into the hollow support member (to inhibit autodoping by sweeping out-diffused dopant atoms away from the substrate backside).

30 Claims, 7 Drawing Sheets

U.S. PATENT DOCUMENTS

| | | | |
|---|---|---|---|
| 5,098,198 A | 3/1992 | Nulman et al. | |
| 5,133,284 A | 7/1992 | Thomas et al. | |
| 5,177,878 A * | 1/1993 | Visser | 34/92 |
| 5,230,741 A | 7/1993 | van de Ven et al. | |
| 5,292,554 A | 3/1994 | Sinha et al. | |
| 5,304,248 A | 4/1994 | Cheng et al. | |
| 5,326,725 A | 7/1994 | Sherstinsky et al. | |
| 5,328,722 A | 7/1994 | Ghanayem et al. | |
| 5,383,971 A | 1/1995 | Selbrede | |
| 5,384,008 A | 1/1995 | Sinha et al. | |
| 5,476,548 A | 12/1995 | Lei et al. | |
| 5,516,367 A | 5/1996 | Lei et al. | |
| 5,531,835 A | 7/1996 | Fodor et al. | |
| 5,534,073 A | 7/1996 | Kinoshita et al. | |
| 5,556,476 A | 9/1996 | Lei et al. | |
| 5,748,435 A | 5/1998 | Parkhe | |
| 5,960,555 A | 10/1999 | Deaton et al. | |
| 6,063,203 A | 5/2000 | Satoh | |
| 6,093,252 A | 7/2000 | Wengert et al. | |
| 6,113,702 A | 9/2000 | Halpin et al. | |
| 6,133,702 A | 10/2000 | Noble et al. | |
| 6,248,176 B1 * | 6/2001 | Yudovsky et al. | 118/715 |
| 6,343,163 B1 * | 1/2002 | Kawanishi | 385/2 |
| 6,343,183 B1 * | 1/2002 | Halpin et al. | 392/416 |
| 6,444,027 B1 | 9/2002 | Yang et al. | |
| 6,454,865 B1 | 9/2002 | Goodman et al. | |
| 6,464,795 B1 | 10/2002 | Sherstinsky et al. | |
| 6,491,757 B2 * | 12/2002 | Halpin et al. | 118/666 |
| 6,596,095 B2 * | 7/2003 | Ries et al. | 148/33.1 |
| 6,634,882 B2 | 10/2003 | Goodman | |
| 6,652,650 B2 * | 11/2003 | Yang et al. | 117/200 |
| 6,893,507 B2 | 5/2005 | Goodman et al. | |
| RE38,937 E | 1/2006 | Nakamura | |
| 7,070,660 B2 * | 7/2006 | Keeton et al. | 118/725 |
| 2001/0037761 A1 | 11/2001 | Ries et al. | |
| 2003/0049580 A1 | 3/2003 | Goodman | |
| 2003/0168174 A1* | 9/2003 | Foree | 156/345.51 |
| 2003/1016817 * | 9/2003 | Foree | 156/345.51 |
| 2004/0226515 A1 | 11/2004 | Yendler et al. | |
| 2004/0266181 A1 | 12/2004 | Schauer et al. | |
| 2005/0022746 A1 | 2/2005 | Lampe et al. | |
| 2005/0092439 A1* | 5/2005 | Keeton et al. | 155/345.51 |
| 2005/0115679 A1 | 6/2005 | Kurosawa et al. | |
| 2006/0079089 A1 | 4/2006 | Schauer et al. | |
| 2006/0222481 A1* | 10/2006 | Foree | 414/800 |
| 2007/0089670 A1 | 4/2007 | Ikedo | |

FOREIGN PATENT DOCUMENTS

| | | |
|---|---|---|
| EP | 1137042 A | 9/2001 |
| JP | 10-223545 A | 8/1998 |
| JP | 10-340896 | 12/1998 |
| JP | 11-87250 | 3/1999 |

* cited by examiner

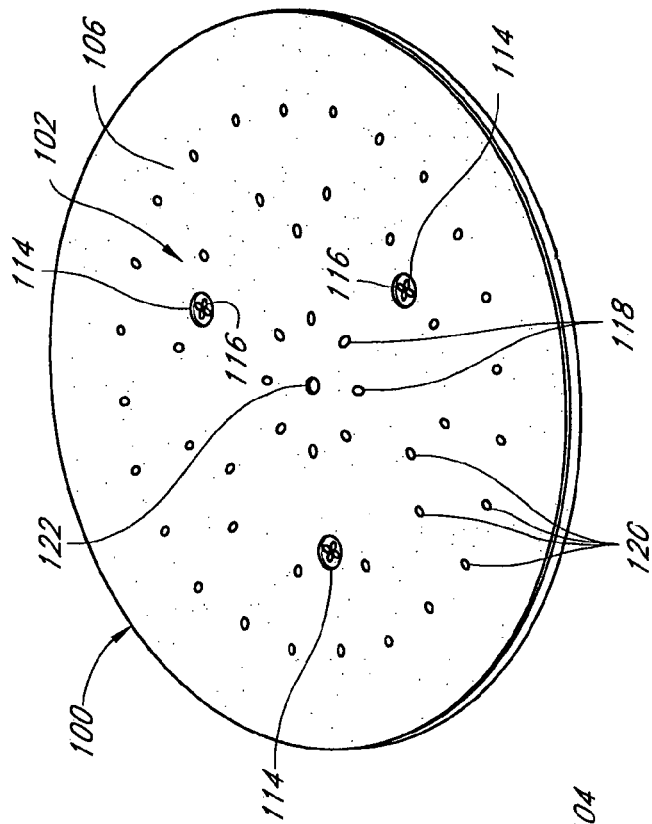
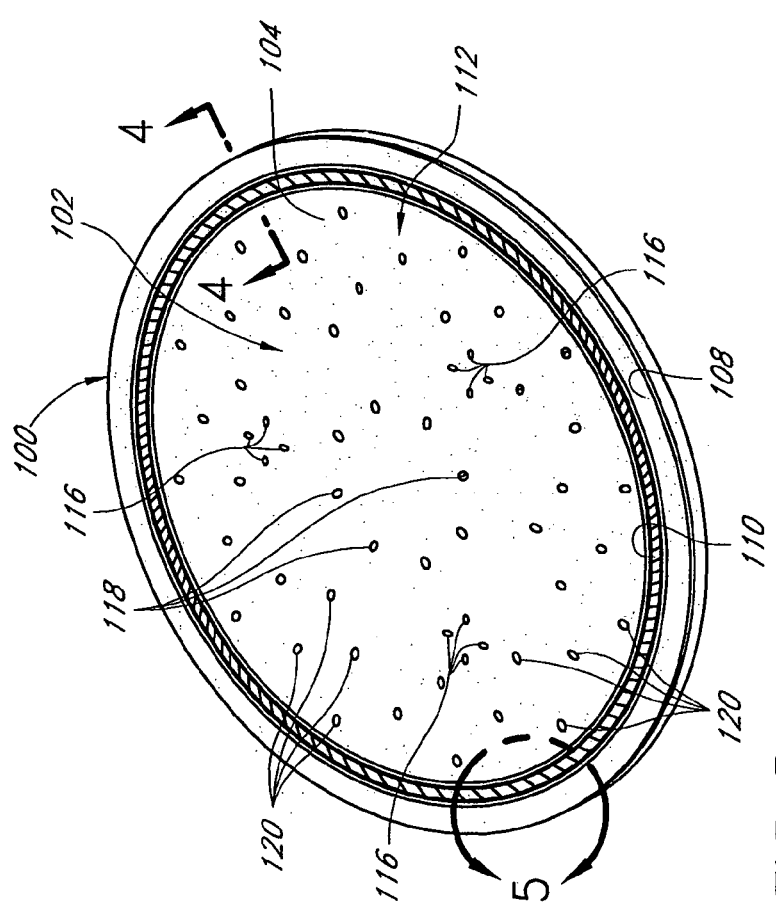

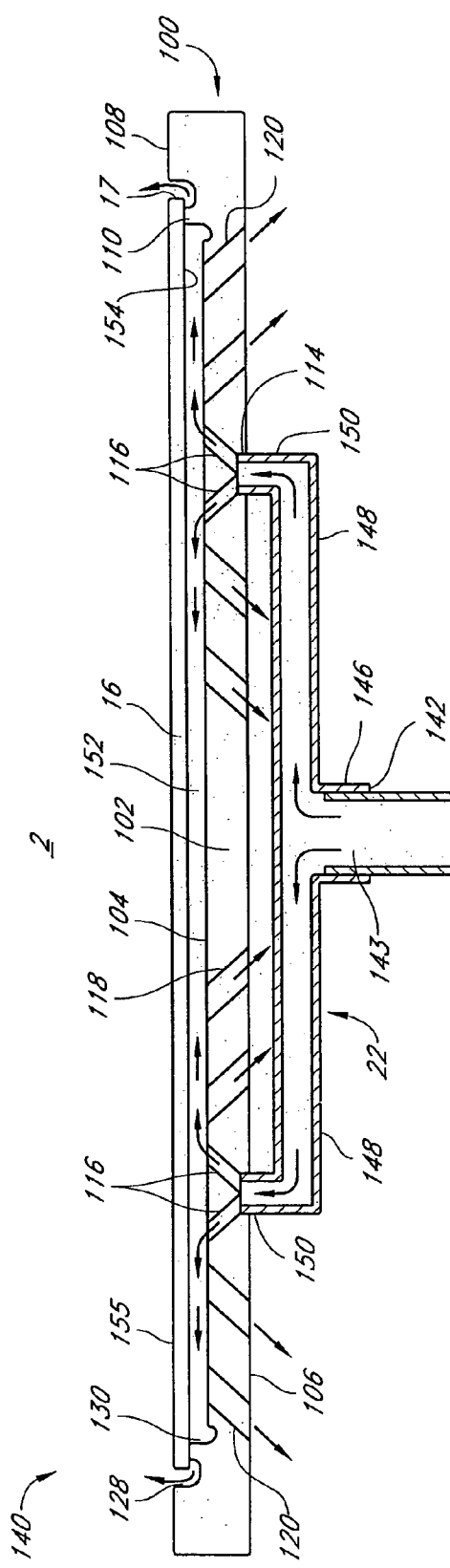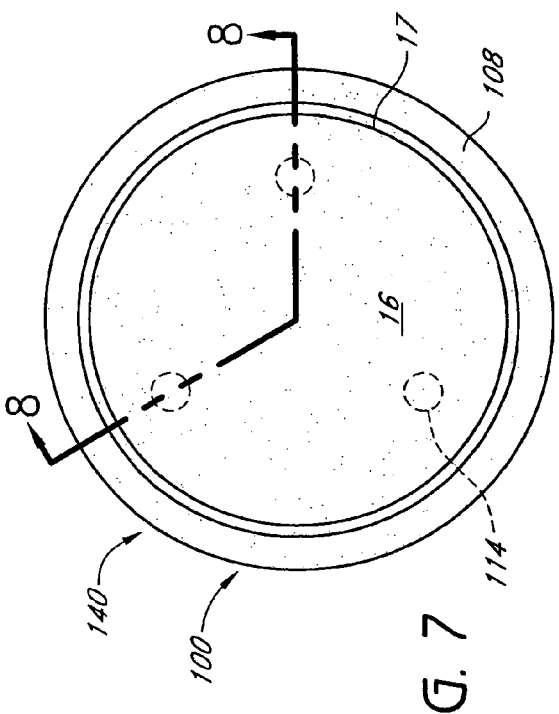
FIG. 7
FIG. 8

SUBSTRATE SUPPORT SYSTEM FOR REDUCED AUTODOPING AND BACKSIDE DEPOSITION

CLAIM FOR PRIORITY

This application claims priority under 35 U.S.C. § 119(e) to Provisional Patent Application Ser. No. 60/545,181 to Goodman et al., filed Feb. 13, 2004, and Provisional Patent Application Ser. No. 60/591,258 to Stoutyesdijk et al., filed Jul. 26, 2004.

INCORPORATION BY REFERENCE

This application hereby incorporates by reference the entire disclosures of U.S. Pat. No. 6,093,252; Patent Application Publication No. US 2005/0092439 A1 to Keeton et al., published May 5, 2005; Provisional Patent Application Ser. No. 60/545,181 to Goodman et al., filed Feb. 13, 2004; and Provisional Patent Application Ser. No. 60/591,258 to Stoutyesdijk et al., filed Jul. 26, 2004.

BACKGROUND OF THE INVENTION

1. Field of the Invention

The present invention relates generally to semiconductor processing equipment and specifically to systems and methods for supporting a substrate during material deposition processes.

2. Description of the Related Art

High-temperature ovens, or reactors, are used to process substrates for a variety of reasons. In the electronics industry, substrates such as semiconductor wafers are processed to form integrated circuits. A substrate, typically a circular silicon wafer, is placed on a substrate holder. If the substrate holder helps to attract radiant heat, it is called a susceptor. The substrate and substrate holder are enclosed in a reaction chamber, typically made of quartz, and heated to high temperatures by a plurality of radiant heat lamps placed around the quartz chamber. In an exemplary high temperature process, a reactant gas is passed over the heated substrate, causing the chemical vapor deposition (CVD) of a thin layer of the reactant material onto a surface of the substrate. As used herein, the terms "processing gas," "process gas," and "reactant gas" generally refer to gases that contain substances to be deposited upon a substrate (such as silicon-containing gases). As used herein, these terms do not include cleaning gases. Through subsequent processes, the layers of reactant material deposited on the substrate are made into integrated circuits. The process gas flow over the substrate is often controlled to promote uniformity of deposition across the top or front side of the substrate. Deposition uniformity can be further promoted by rotating the substrate holder and wafer about a vertical center axis during deposition. As used herein, the "front side" of a substrate refers to the substrate's top surface, and the "backside" of a substrate refers to the substrate's bottom surface.

As mentioned above, a typical substrate to be processed comprises a thin layer of silicon. In the production of integrated circuits, it is sometimes desirable to deposit additional silicon (e.g., via CVD) onto the substrate surface(s). If the new silicon is deposited directly onto the silicon surface of the substrate, the newly deposited silicon maintains the crystalline structure of the substrate. This is known as epitaxial deposition. However, the surfaces of the original substrate to be processed are typically polished and naturally covered with a native oxide layer (e.g., $SiO_2$). The deposition of new silicon onto the native oxide layer is known as polysilicon deposition. In order to conduct epitaxial deposition, it is ordinarily necessary to remove the native oxide layer from each surface (i.e., the substrate's top and/or bottom surfaces) onto which the new silicon is to be deposited. The native oxide layer is typically removed by exposing it to a cleaning gas, such as hydrogen gas ($H_2$), prior to the deposition of new silicon. As used herein, the term "cleaning gas" is different than and does not encompass reactant gases.

There are a large variety of different types of substrate holders for supporting a substrate during processing. A typical substrate holder comprises a body with a generally horizontal upper surface that underlies the supported substrate. A spacer means is often provided for maintaining a small gap between the supported substrate and the horizontal upper surface. This gap prevents process gases from causing the substrate to stick to the substrate holder. The substrate holder often includes an annular shoulder that closely surrounds the supported substrate. One type of spacer means comprises a spacer element fixed with respect to the substrate holder body, such as an annular lip, a plurality of small spacer lips, spacer pins or nubs, etc. An alternative type of spacer element comprises a plurality of vertically movable lift pins that extend through the substrate holder body and are controlled to support the substrate above the upper surface of the substrate holder. Often, the spacer element is positioned to contact the substrate only within its "exclusion zone," which is a radially outermost portion of the substrate within which it is difficult to maintain deposition uniformity. The exclusion zone is normally not used in the development of integrated circuits for commercial use. A processed substrate may be characterized, for example, as having an exclusion zone of 5 mm from its edge.

One problem associated with CVD is the phenomenon of "backside deposition." Many substrate holders are unsealed at the substrate perimeter, so that process gases can flow down around the peripheral edge of the substrate and into the gap between the substrate and the substrate holder. These gases tend to deposit on the substrate backside, both as nodules and as an annular ring at or near the substrate edge. This creates non-uniformities in substrate thickness, generally detected by nanotopology tools. Such non-uniformities in substrate thickness can adversely affect, and in many cases make impossible, subsequent processing steps, such as photolithography.

Prior to epitaxial deposition, the front side of the substrate is typically exposed to a cleaning gas to remove the native oxide layer. However, the unsealed substrate perimeter permits the cleaning gas to contact the backside of the substrate, resulting in oxide removal on the backside. The amount of cleaning gas that contacts the substrate backside is ordinarily not sufficient to remove the entire oxide layer therefrom. However, the cleaning gas tends to create pinhole openings in the oxide layer on the substrate backside, exposing the silicon surface. In particular, the pinhole openings tend to form in an annular ring or "halo." Of course, the longer the exposure to cleaning gas, the further inward the cleaning gas effuses toward the substrate's center, creating more pinhole openings in the oxide layer. Some of the removed oxide can redeposit onto the oxide layer of the substrate backside to form concentrated bumps of $SiO_2$. Once deposition begins, the process gases can similarly effuse around the substrate edge from above the substrate. The partial native oxide removal can result in mixed deposition of process gas materials on the substrate backside—epitaxial deposition on the exposed silicon surfaces and polysilicon deposition on the oxide layer. The halo's intensity is sometimes increased because the concentrated $SiO_2$ may receive non-depleted process gases. This can result in small polysilicon growths or bumps. These bumps of polysilicon scatter light and lead to a thick haziness. Thus, one way that backside deposition can be detected is to conduct epitaxial deposition and then look at the substrate backside for the presence of a halo or haziness.

One method to reduce backside deposition involves the use of a purge gas that flows upward around the wafer edge to reduce the downward flow of cleaning or process gases. For example, U.S. Pat. No. 6,113,702 to Halpin et al. discloses a two-piece susceptor supported by a hollow gas-conveying spider. The two pieces of the susceptor form gas flow passages therebetween. During deposition, an inert purge gas is conveyed upward through the spider into the passages formed in the susceptor, the purge gas flowing upward around the substrate edges to inhibit the flow of process gases to the substrate backside.

Another problem in semiconductor processing is known as "autodoping." The formation of integrated circuits involves the deposition of dopant material (such as doped silicon) onto the front side of the substrate. Autodoping is the tendency of dopant atoms to diffuse downward through the substrate, emerge from the substrate backside, and then travel between the substrate and the substrate holder up around the substrate edge to redeposit onto the substrate front side, typically near the substrate edge. These redeposited dopant atoms can adversely affect the performance of the integrated circuits, particularly semiconductor dies from near the substrate edge. Autodoping tends to be more prevalent and problematic for higher-doped substrates.

One method of reducing autodoping involves a susceptor that has a plurality of holes that permit the flow of gas between the regions above and below the susceptor. Autodoping is reduced by directing a flow of gas horizontally underneath the susceptor. Some of the gas flows upward through the holes of the susceptor into a gap region between the susceptor and a substrate supported thereon. As diffused dopant atoms emerge at the substrate backside, they become swept away by the gas downward through the holes in the susceptor. In this way, the dopant atoms tend to get swept down into the region below the susceptor by a venturi effect. Exemplary references disclosing conventional substrate holders employing this method are U.S. Pat. No. 6,444,027 to Yang et al. and U.S. Pat. No. 6,596,095 to Ries et al.

SUMMARY OF THE INVENTION

Conventional substrate support methods and systems for preventing backside deposition and autodoping are somewhat limited. Conventional purge gas systems typically include gas flow channels for the flow of purge gas through the substrate holder. These channels often result in the direct impingement of relatively focused, high velocity flows of purge gas onto the substrate backside. This can cause localized cooling or "cold spots" in the substrate, which adversely affects the uniformity of deposited materials on the substrate. Also, conventional purge gas systems are typically not designed to prevent autodoping.

Conversely, conventional systems for preventing autodoping are typically not designed to prevent backside deposition of reactant gases. For example, the system disclosed in either of U.S. Pat. No. 6,444,027 to Yang et al. and U.S. Pat. No. 6,596,095 to Ries et al. requires a relatively large flow of gas underneath the substrate holder to sweep out the out-diffused dopant atoms from the backside of the supported substrate through the passages in the substrate holder. Also, those systems typically require a completely or nearly fluid-tight separation between the regions above and below the substrate holder, in order to prevent reactant gases from flowing underneath the substrate holder and upward through the substrate holder passages to the substrate backside. Unfortunately, it is often very difficult to effect a completely fluid-tight separation between the regions above and below the substrate holder. Divider plates are typically provided, but some clearance usually remains, particularly if the substrate holder is designed to be rotated during processing. Thus, there is a significant risk of deposition of reactant gases on the substrate backside.

Accordingly, it is a principle object and advantage of the present invention to overcome some or all of these limitations and to provide an improved design for a substrate support system. Another object and advantage of the present invention is to provide a simple, versatile substrate holder that facilitates reduced backside deposition and autodoping. Another object and advantage of the present invention is to provide a system and method in which a forced flow of gas inhibits both backside deposition and autodoping. Another object and advantage of the present invention is to provide a hollow support member for supporting the underside of the substrate holder and conveying the forced flow of gas upward into passages of the substrate holder. Another object and advantage of the present invention is to configure this hollow support member so that the upwardly conveyed gas migrates somewhat slowly and indirectly to the substrate backside to thereby reduce the risk of localized cooling in the substrate. Other objects and advantages of the present invention will be understood from the description below.

In one aspect, the present invention provides a substrate support system comprising a substrate holder for holding a substrate. The substrate holder comprises a central portion, at least one spacer extending upward from the central portion, and a hollow support member. The central portion has an upper surface, a lower surface, and a plurality of open passages extending from the upper surface to the lower surface. The at least one spacer has an upper support surface raised above the upper surface of the central portion. The at least one spacer's upper support surface is configured to support a peripheral portion of the substrate so that a gap region exists between the upper surface of the central portion and a bottom surface of the substrate. The hollow support member has an inlet adapted to engage an outlet of a gas-conveyor to facilitate gas flow from the gas-conveyor into the hollow support member. The hollow support member also has one or more upper open ends adapted to support the lower surface of the central portion of the substrate holder. The one or more upper open ends are configured to convey gas upward into lower ends of one or more of the passages in the central portion of the substrate holder. At least one of the passages has a lower end open to a region that is not inside the hollow support member.

In another aspect, the present invention provides a substrate support system comprising a substrate holder for holding a substrate, and a hollow support spider. The substrate holder comprises a central portion and a plurality of spacers extending upward therefrom. The central portion has an upper surface, a lower surface, and a plurality of passages extending from the upper surface to the lower surface. The spacers have upper support surfaces raised above the upper surface of the central portion. The spacers' upper support surfaces are configured to support a peripheral portion of the substrate so that a gap region exists between the upper surface of the central portion and a bottom surface of the substrate. The support spider comprises a hollow manifold and a plurality of hollow arms extending generally radially outward and upward therefrom. The manifold has an inlet adapted to engage an outlet of a gas-conveyor to facilitate gas flow from the gas-conveyor into the manifold. The hollow arms are configured to receive gas flow from the manifold. The hollow arms have open upper ends adapted to support the lower surface of the central portion of the substrate holder. The open upper ends of the hollow arms are configured to convey gas upward into a subset of the passages of the central portion of the substrate holder.

In another aspect, the present invention provides a substrate support system comprising a substrate holder for holding a substrate, and a hollow support member. The substrate holder comprises a generally planar central portion and a plurality of spacers extending upward therefrom. The central portion has an upper surface, a lower surface, and a plurality of open passages extending from the upper surface to the lower surface. The spacers have upper support surfaces raised above the upper surface of the central portion. The spacers' upper support surfaces are configured to support a peripheral portion of the substrate so that a gap region exists between the upper surface of the central portion and a bottom surface of the substrate. The hollow support member comprises a lower base member and an annular wall extending upward therefrom. The base member has an inlet adapted to engage an outlet of a gas-conveyor to facilitate gas flow from the gas-conveyor into the hollow support member. The annular wall has an upper edge configured to support a bottom surface of the substrate holder so that gas within the annular wall and between the base member and the bottom surface of the substrate holder is substantially prevented from flowing between the upper edge of the annular wall and the bottom surface of the substrate holder. The upper edge of the annular wall defines an upper opening of the hollow support member. This upper opening is configured to convey gas upward into lower ends of at least 10 of the passages of the central portion of the substrate holder.

In another aspect, the present invention provides a substrate holder for holding a substrate, comprising a central portion and a plurality of spacers extending upward therefrom. The central portion has an upper surface, a lower surface, a first set of open passages extending from the upper surface to the lower surface, and a second set of open passages each extending from the upper surface to one of a plurality of recesses within the lower surface. Each of the recesses is adapted to receive one of a plurality of corresponding upper ends of tubular arms of a hollow support member configured to support the central portion and convey gas upward into the second set of passages. The spacers have upper support surfaces raised above the upper surface of the central portion. The spacers' upper support surfaces are configured to support a peripheral portion of the substrate so that a gap region exists between the upper surface of the central portion and a bottom surface of the substrate.

In yet another aspect, the present invention provides a hollow support member for supporting a substrate holder that is in turn configured to support a substrate during substrate processing. The hollow support member comprises a base member and an annular wall extending upward therefrom. The base member has a lower inlet adapted to engage an upper end of a hollow tube to facilitate upward gas flow from the tube into the hollow support member. The annular wall has an upper edge configured to support a bottom surface of the substrate holder so that gas within the annular wall and between the base member and the bottom surface of the substrate holder is substantially prevented from flowing between the upper edge of the annular wall and the bottom surface of the substrate holder. The upper edge defines an upper opening of the hollow support member. The upper opening defines an area of at least 70% of the size of a substrate that the substrate holder is specifically designed to support.

In yet another aspect, the present invention provides a method of processing a substrate. The method involves a substrate holder comprising a generally planar central portion and a plurality of spacers extending upward therefrom. The central portion has an upper surface, a lower surface, and plurality of passages extending from the upper surface to the lower surface. The spacers have upper support surfaces raised above the upper surface of the central portion. The spacers' upper support surfaces are configured to support a peripheral portion of a substrate so that a gap region exists between the upper surface of the central portion and a bottom surface of the substrate. According to the method, the substrate holder is provided and then a substrate is rested thereon so that the spacers' upper support surfaces support a peripheral portion of the substrate. An upward flow of gas is directed directly into lower ends of one or more selected ones of the passages so that the gas flows into the gap region. Lower ends of a remaining one or more passages of the substrate holder are left open.

In still another aspect, the present invention provides a method of processing a substrate. The method involves a substrate holder comprising a generally planar central portion and a plurality of spacers extending upward therefrom. The central portion has an upper surface, a lower surface, and plurality of open passages extending from the upper surface to the lower surface. The spacers have upper support surfaces raised above the upper surface of the central portion. The spacers' upper support surfaces are configured to support a peripheral portion of a substrate so that a gap region exists between the upper surface of the central portion and a bottom surface of the substrate. According to the method, the substrate holder is provided and then a substrate is rested thereon so that the spacers' upper support surfaces support a peripheral portion of the substrate. A hollow support member is then provided, the hollow support member having a base and an annular wall extending upward from the base. The annular wall has an upper edge configured to engage a bottom surface of the substrate holder. The annular wall is engaged with the bottom surface of the substrate holder so that some of the passages have lower ends positioned to direct downwardly emerging gas into the hollow support member and at least one of the passages has a lower end positioned to direct downwardly emerging gas into a region exterior of the hollow support member. A flow of gas is then directed directly into an inlet of the hollow support member.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 2 is a top perspective view of a substrate holder according to one embodiment of the invention.

FIG. 3 is a bottom perspective view of the substrate holder of FIG. 2.

FIG. 7 is a top view of a substrate support system according to a first embodiment of the invention.

FIG. 8 is a cross-sectional view of the substrate support system of FIG. 7, taken along lines 8-8 thereof.

The drawings may not be drawn to scale.

DETAILED DESCRIPTION OF THE PREFERRED EMBODIMENTS

Figure 1:
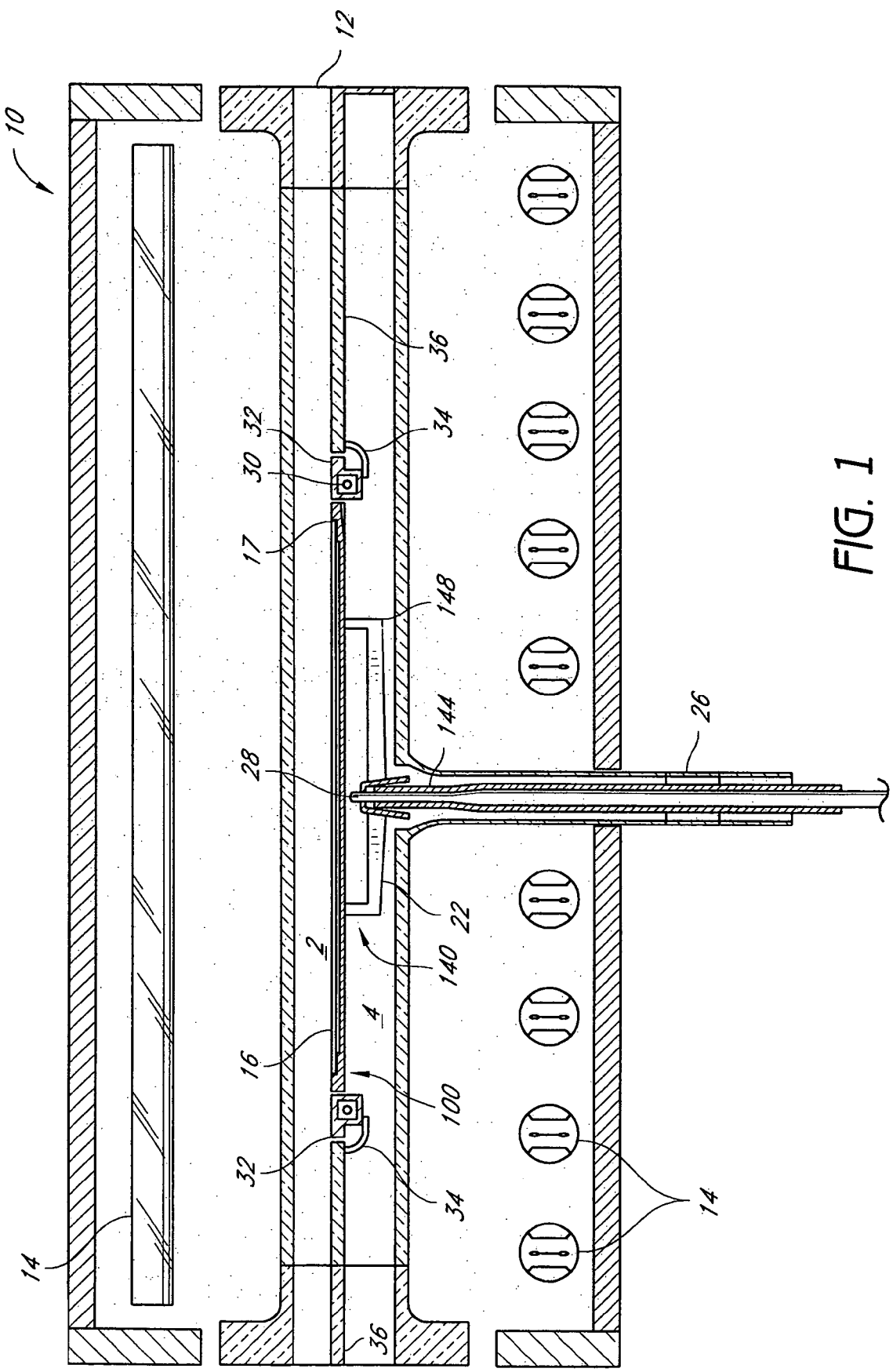
FIG. 1 is a schematic, cross-sectional view of an exemplary reaction chamber with a substrate supported on a substrate holder therein.

Prior to describing the substrate holder of the invention, an exemplary CVD reactor is disclosed. FIG. 1 illustrates an exemplary CVD reactor 10, including a quartz reaction chamber 12. Radiant heating elements 14 are supported outside the transparent chamber 12, to provide heat energy to the chamber 12 without appreciable absorption by the chamber walls. Although the preferred embodiments are described in the context of a "cold wall" CVD reactor, it will be understood that the substrate support systems described herein can be used in other types of reactors and semiconductor processing equipment. Skilled artisans will appreciate that the claimed invention is not limited to use within the particular reactor 10 disclosed herein. In particular, one of skill in the art can find application for the substrate support systems described herein for other semiconductor processing equipment, wherein a substrate is supported while being uniformly heated or cooled. Moreover, while illustrated in the context of standard silicon wafers, the supports described herein can be used to support other kinds of substrates, such as glass, which are subjected to treatments such as CVD, physical vapor deposition (PVD), etching, annealing, dopant diffusion, photolithography, etc. The supports are of particular utility for supporting substrates during treatment processes at elevated temperatures. Also, skilled artisans will appreciate that this invention includes substrate holders that are susceptors as well as those that are not susceptors. An alternative exemplary reaction chamber suitable for the substrate support system of this invention is described in U.S. Pat. No. 6,093,252.

The radiant heating elements 14 typically include two banks of elongated tube-type heating lamps arranged in orthogonal or crossed directions above and below a substrate holder holding a semiconductor substrate. Each of the upper and lower surfaces of the substrate faces one of the two banks of heating lamps 14. A controller within the thermal reactor adjusts the relative power to each lamp 14 to maintain a desired temperature during wafer processing. There are also spot lamps that are used for compensating for the heat sink effect of lower support structures.

The illustrated substrate comprises a semiconductor wafer 16 with a generally circular edge 17, shown in FIG. 1 supported within the reaction chamber 12 upon a substrate support system 140. The illustrated support system 140 includes a substrate holder 100, upon which the wafer 16 rests, and a hollow support spider 22 that supports the holder 100. An embodiment of the substrate holder 100 is shown in greater detail in FIGS. 2-6 (described below). The substrate support system 140 is shown in greater detail in FIGS. 7 and 8. The spider 22 is preferably made of a transparent and non-metallic (to reduce contamination) material. The spider 22 is mounted to a gas-conveyor 144 (e.g., a tube or shaft), which extends downwardly through a tube 26 depending from the lower wall of the chamber 12. The spider 22 has at least three hollow substrate holder supporters or arms 148, which extend radially outward and upward from the shaft 24. The arms 25 are preferably separated by equal angles about a vertical center axis of the shaft 24, which is preferably aligned with a vertical center axis of the substrate holder 100 and wafer 16. For example, if there are three arms 148, they are preferably separated from one another by 120°. The arms 148 are configured to support the bottom surface of the substrate holder 100, as described below. In a preferred embodiment, the substrate holder 100 comprises a susceptor capable of absorbing radiant energy from the heating elements 14 and re-radiating such energy. Preferably, the substrate holder 100 is solid and made of one piece. Preferably, the gas-conveyor 144, spider 22, and holder 100 are configured to rotate in unison about a vertical center axis during substrate processing.

A central temperature sensor or thermocouple 28 may be provided for sensing the temperature at the center of the substrate holder 100. In the illustrated embodiment, the temperature sensor 28 extends through the gas-conveyor 144 and the spider 22 in proximity to the substrate holder 100. Additional peripheral temperature sensors or thermocouples 30 are also shown housed within a slip ring or temperature compensation ring 32, which surrounds the substrate holder 100 and the wafer 16. The thermocouples 28, 30 are connected to a temperature controller (not shown), which controls and sets the power of the various radiant heating elements 14 in response to the readings of the thermocouples 28, 30.

In addition to housing the thermocouples 30, the slip ring 32 also absorbs radiant heat during high temperature processing. The heated slip ring 32 helps to reduce heat loss at the wafer edge 17. The slip ring 32 can be suspended by any suitable means. For example, the illustrated slip ring 32 rests upon elbows 34, which depend from the quartz chamber dividers 36. The dividers 36 divide the reactor 10 into an upper chamber 2 designed for the flow of reactant or process gases (e.g., for CVD on the substrate surface) and a lower chamber 4. Preferably, the dividers 36 and other elements of the reactor 10 substantially prevent fluid communication between the chambers 2 and 4. However, because the substrate holder 100 is preferably rotatable about a vertical center axis, a small clearance typically exists between the holder 100 and the slip ring 32 (or other elements). Thus, it is often difficult to completely prevent fluid communication between the chambers 2 and 4.

FIGS. 2 and 3 are top and bottom perspective views, respectively, of one embodiment of the substrate holder 100. The illustrated holder 100 is formed in one piece and is generally circular and disk-shaped. It includes a central portion 102 having an upper surface 104 and a lower surface 106. The upper surface 104 can be generally flat or planar, or it can alternatively be concave. The upper surface of the holder 100 includes a plurality of spacers having upper surfaces configured to support a semiconductor substrate 16 (FIG. 1). In the illustrated embodiment, such spacers comprise a ring 110 of spacer vanes 124 (FIGS. 5, 6) that collectively surround or encircle the upper surface 104 of the central portion 102. As described below, the spacer vanes 124 have upper surfaces configured to support the peripheral portion of the backside of a semiconductor substrate 16 (FIG. 1). Preferably, the spacer vanes 124 are polished to prevent or minimize scratching of the backside of the substrate 16. Preferably, the vanes 124 contact the substrate 16 only within its exclusion zone. The use of vanes, versus a solid substrate-support ledge, minimizes heat conduction from the substrate holder to the backside of the substrate 16 (at the substrate edge 17). This reduces temperature non-uniformities in the substrate 16 (due to temperature differences between the substrate and substrate holder 100) and thus improves slip performance. However, the ring 110 of vanes 124 could be replaced by a solid support ledge. A raised annular shoulder 108 surrounds the ring 110 of vanes 124. The shoulder 108 defines a substrate pocket 112 that receives the substrate 16 supported on the spacer vanes 124. In one embodiment, the substrate holder 100 is a susceptor capable of absorbing and re-radiating radiant energy. Such a susceptor can be formed of graphite coated with silicon carbide, although skilled artisans will appreciate that other materials may be suitable.

With reference to FIG. 3, the lower surface 106 of the central portion 102 of the substrate holder 100 preferably includes a plurality of recesses 114 that are each sized and configured to receive an upper end 150 of a support arm 148 of the hollow multi-armed support spider 22 (FIGS. 1, 8). Preferably, the number of recesses 114 is equal to the number of arms 148 of the spider 22. Preferably, each recess 114 is sized to receive its corresponding support arm 148 snugly, to minimize the escape of gas as described below. However, a loose fit can be had if desired. Preferably, the recesses 114 are separated by equal angular intervals about the center of the substrate holder 100. In the illustrated embodiment, the three recesses 114 are separated by angular intervals of 120°. Preferably, the recesses 114 are radially positioned far enough from the center of the substrate holder 100 to permit the spider 22 to provide stable support to the holder 100, but not so far as to introduce a risk of the spider arms 148 sagging due to excessive moment forces (which is known to occur in some systems).

The central portion 102 of the substrate holder 100 includes a plurality of passages or holes extending from the upper surface 104 to the lower surface 106. In the illustrated embodiment, the passages comprise a first set of twelve passages 116, a second set of eight passages 118 located radially inward of the first set of passages 116, and a third set of thirty-nine passages 120 located radially outward of the first set of passages 116. As shown in FIG. 3, the lower ends of the passages 116 are within the recesses 114. In the illustrated embodiment, each recess 114 includes the lower ends of four of the passages 116. The passages 118 are arranged generally in a circle near and around the center of the substrate holder 100. The passages 120 are arranged generally in three concentric circles radially between the ring 110 of vanes and the three groups of passages 116. It will be understood that there are a great variety of possible arrangements of the passages in the central portion 102, and that the illustrated arrangement is merely one possibility. The number of passages 116, 118, and 120 is preferably within about 9-250, but could also be within about 6-225, within about 20-250, within about 50-200, within about 100-200, or within about 100-250. The lower surface 106 of the central portion 102 has a density of passages 116, 118, and 120 preferably within 0.01-3.0 passages per $cm^2$, but it could also range within 0.05-2.5 passages per $cm^2$, 0.10-2.5 passages per $cm^2$, 0.20-2.5 passages per $cm^2$, or 0.50-2.0 passages per $cm^2$. As shown in FIG. 3, the holder 100 includes a center recess 122 adapted to receive the central temperature sensor or thermocouple 28 (FIG. 1).

Preferably, the first set of passages 116 are inclined or angled with respect to vertical so that gas flowing upward through the passages 116 of one recess 114 is directed away from the center of the recess 114. Preferably, some or all of the second set of passages 118 are inclined so that their upper ends (at the upper surface 104 of the central portion 102) are radially outward of their lower ends (at the lower surface 106 of the central portion 102). Preferably, some or all of the third set of passages 120 are inclined so that their upper ends (at the upper surface 104) are radially inward of their lower ends (at the lower surface 106 of the central portion 102). The passages 116, 118, and 120 are preferably inclined at an angle of within 30°-60° with respect to vertical, and more preferably at an angle of about 45° with respect to vertical. The diameter of the passages 116 is preferably within 0.04-0.25 inches, and more preferably about 0.080 inches. The diameter of the passages 118 and 120 is preferably within 0.04-0.25 inches, and more preferably about 0.100 inches. Other passage diameters are possible, giving due consideration to the goal of permitting gas flow through the passages.

The passages 116, 118, and 120 can be generally evenly distributed throughout the central portion 102. In other embodiments, the passages can be unevenly distributed throughout the central portion 102. The passages can form any suitable pattern for delivering fluid through the central portion 102. It is contemplated that the passages can have any suitable size and configuration to achieve the desired fluid flow through the substrate holder 100. The diameter and orientation of the passages can be determined based upon, for example, the desired flow rate of the gas passing through the central portion 102 and the desired angle at which the gas delivered by the passages hits the backside 154 of the substrate 16. Additionally, the passages can be similar to or different than one another, as desired.

Figure 5:
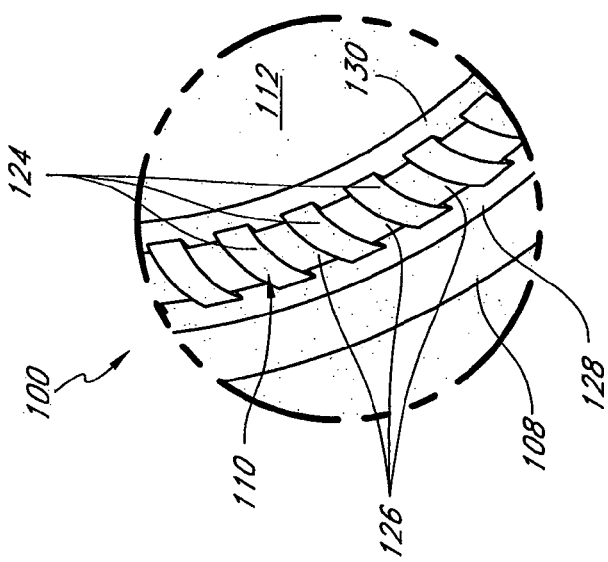
FIG. 5 is an enlarged view of a portion of the substrate holder of FIG. 2 indicated by arrows 5 thereof.
Figure 6:
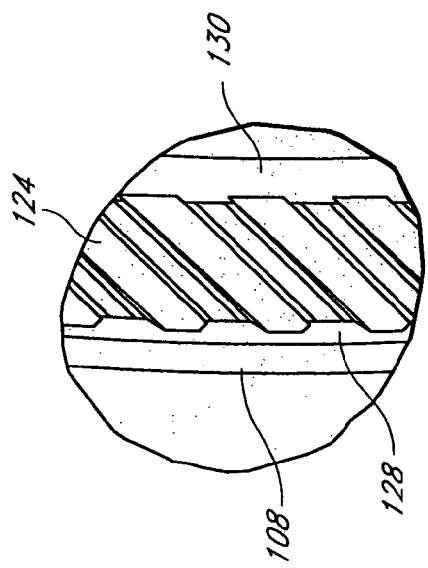
FIG. 6 is a top view of a portion of a substrate holder according to another embodiment of the invention.
Figure 4:
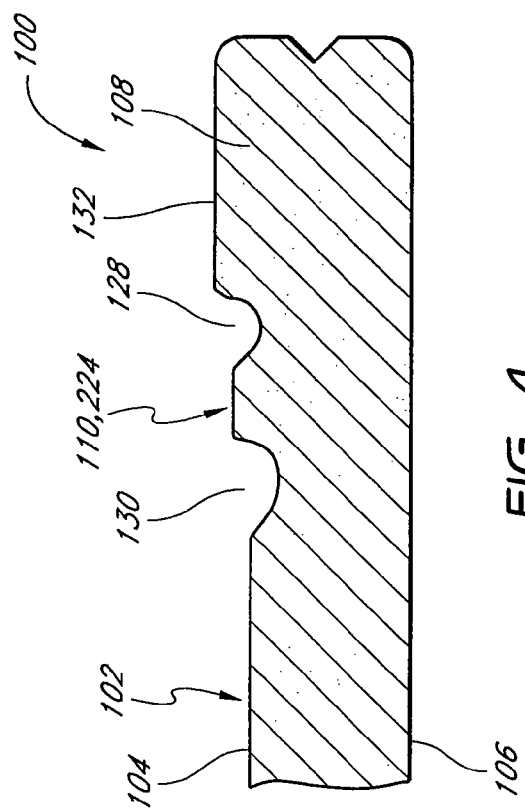
FIG. 4 is a partial cross-sectional view of the substrate holder of FIG. 2, taken along line 4-4 thereof.

FIGS. 4 and 5, which are a sectional view and an enlarged top view of a peripheral portion of the substrate holder 100 of FIGS. 2 and 3, show in greater detail the edge configuration of the holder. As mentioned above, the holder 100 includes an outer annular shoulder 108 outside of the ring 110 of spacer vanes 124. Preferably, the upper surface 132 of the shoulder 108 is raised above the vanes 124, so that the shoulder 108 surrounds the peripheral edge 17 of a substrate 16 (FIGS. 1, 7, and 8) supported on the vanes 124. In a preferred embodiment, the spacer vanes 124 are spaced apart and generally parallel to one another, with each of the vanes 124 being angled with respect to a center of the ring 110 of vanes. In this context, "generally parallel" means that the vanes 124 are oriented in the same general direction and, if curved, have somewhat conforming side-by-side curvature. The vanes 124 shown in FIG. 5 are somewhat curved so that their radially inward ends are oriented closer to the radial direction than their radially outward ends. Channels 126 are defined between the vanes 124. With reference to FIG. 5, it will be appreciated that when the holder 100 is rotated clockwise, the angled vanes 124 substantially inhibit or resist radially inward flow of gas through the channels 126 and substantially assist radially outward flow of gas through the channels 126. When the holder 100 is rotated counter-clockwise, the opposite effect is observed. Skilled artisans will appreciate that the spacer vanes 124 can alternatively be straight (as opposed to curved as shown in FIG. 5). FIG. 6 shows an alternative configuration in which the vanes 124 are straight.

In the embodiment illustrated in FIGS. 4 and 5, the ring 110 of spacer vanes 124 is surrounded by a shallow annular groove 128, which helps to minimize radiation losses from the substrate 16 (FIG. 1) to the substrate holder 100. The holder 100 also includes an annular thermal isolation groove 130 positioned radially inward from the vaned ring 110 and the shallow annular groove 128. The thermal isolation groove 130 helps to compensate for the heat conduction from the substrate 16 to the holder 100 in the area of the vaned ring 110, where the substrate 16 is supported by and in thermal contact with the holder 100. Further details of the design and configuration of the spacer vanes 124, groove 128, and groove 130 are provided in Patent Application Publication No. 2005/0092439 A1.

FIGS. 7 and 8 illustrate a substrate support system 140 comprising the substrate holder 100 of FIGS. 2 and 3 supported by a hollow support spider 22. FIG. 7 is a top view showing a substrate 16 supported on the holder 100. In FIG. 7, the outlines of the recesses 114 are shown in dotted lines. FIG. 8 is a sectional view of the substrate support system 140 taken along lines 7-7 of FIG. 7. The support spider 22 includes a hollow body or manifold portion 146 having a lower inlet 142 engaged with an upper end or outlet 143 of a gas-conveyor 144 to facilitate gas flow from the gas-conveyor 144 into the manifold portion 146. The spider 22 preferably engages the gas-conveyor 144 in a fluid-tight manner. In this embodiment, the gas-conveyor 144 comprises a rigid vertical tube. Preferably, the gas-conveyor 144 supports the spider 22. For example, the inlet 142 of the spider 22 can be configured to tightly secure onto the outlet 143 of the gas-conveyor 144 (e.g., threaded engagement). Alternatively, the manifold portion 146 can have an inner flange (not shown) that rests upon the upper end of the gas-conveyor 144. Still further, the manifold portion 146 can be sized such that it is inserted into the outlet 143 of the gas-conveyor 144. Skilled artisans will appreciate that there are a variety of configurations that will result in the gas-conveyor 144 supporting the spider 22, any of which can be applied to any of the embodiments of the present invention.

The spider 22 includes a plurality of hollow tubes or arms 148 extending generally radially outward and upward from the manifold portion 146, the arms 148 being configured to receive gas flow from the manifold portion 146. It will be appreciated that the tubes or arms 148 need not be cylindrical; they can have a variety of different cross-sectional shapes and sizes. Also, their cross-sectional shapes and sizes can vary along their length. The arms 148 have open upper ends 150 that support the lower surface 106 of the central portion 102 of the substrate holder 100. In the illustrated embodiment, the upper ends 150 are received within the recesses 114 of the holder 100. The upper ends 150 of the arms 148 are configured to convey gas upward into the passages 116 within the recesses 114, preferably in a fluid-tight manner. It will be understood that the number of passages 116 into which the spider 22 delivers gas can be varied as desired. In some implementations, it may only be necessary to have one passage 116 that receives gas from the spider 22, in which case the spider may only include one hollow arm 148. The reception of the upper ends 150 of the arms 148 within the recesses 114 also helps to transmit rotation of the spider 22 into rotation of the holder 100.

As shown in FIG. 8, the peripheral portion of a substrate 16 is supported on the upper support surfaces of the ring 110 of spacer vanes 124 (FIGS. 5, 6). The spacer vanes 124 are sized so that a thin gap region 152 exists between the upper surface 104 of the central portion 102 and a backside 154 of the substrate 16. The height of the gap region 152 is controlled by the height of the spacer vanes 124. Preferably, the gap region 152 has a substantially uniform height. For simplicity of illustration, the arrangement and number of the passages 116, 118, and 120 in FIG. 8 is somewhat different than shown in FIGS. 2 and 3. Skilled artisans will appreciate that a large variety of different arrangements and numbers of passages is possible.

The substrate holder 100 and the support spider 22 can be made from materials that have similar or different coefficients of thermal expansion. In one embodiment, the holder 100 and the spider 22 have similar coefficients of thermal expansion to reduce relative movement between the lower surface 106 of the holder 100 and the upper ends 150 of the support arms 48 of the spider 22.

The use of the substrate support system 140 for processing the substrate 16 is now described. The substrate 16 rests upon the substrate holder 100 so that the upper support surfaces of the spacer vanes 124 support a peripheral portion of the substrate. A gas source is provided to inject a flow of inert gas (also known as "purge gas" or "sweep gas") upward through the gas-conveyor 144. In FIG. 8, the flow of the inert gas is depicted by arrows. The inert gas flows into the manifold portion 146 of the support spider 22 and then into the hollow arms 148. The inert gas continues upward through the passages 116 into the gap region 152. As shown, the passages 116 are inclined so that the inert gas flow does not impinge upon the substrate 116 at a 90° angle. This helps to reduce the extent to which the inert gas flow may undesirably cool and create cold spots within the substrate 16. Upon emerging from the passages 116, the inert gas flows throughout the gap region 152. Some of the inert gas flows radially outward through the channels 126 (FIG. 5) between the spacer vanes 124 and upward around the peripheral edge 17 of the substrate 16 into the upper reactor chamber 2. The rest of the inert gas exits the gap region 152 by flowing downward through the passages 118 and 120 of the holder 100 into the lower reactor chamber 4. Optionally, a second flow of gas (preferably inert gas) can be directed into the lower chamber 4 generally underneath and parallel to the lower surface 106 of the central portion 102 of the substrate holder 100 to sweep away the inert gas emerging from the lower ends of the passages 118 and 120. A separate downstream reactor outlet or exhaust can be provided in the chamber 4 underneath the quartz chamber dividers 36 (FIG. 1) for the removal of these mixed gas flows.

As explained above, the second set of passages 118 and the third set of passages 120 are also inclined or angled with respect to vertical. As shown in FIG. 8, the second set of passages 118 are inclined so that their lower ends are radially inward of their upper ends. This facilitates the downward flow of inert gas through the passages 118 because the inert gas tends to flow radially inward from the passages 116 toward the passages 118. The third set of passages 120 are inclined so that their lower ends are radially outward of their upper ends. This facilitates the downward flow of inert gas through the passages 120 because the inert gas also tends to flow radially outward from the passages 116 toward the passages 120. Thus, the described angling of the passages 118 and 120 facilitates the downward flow of the inert gas from the gap region 152 into the lower reactor chamber 4. The angling of the passages 118 and 120 also reduces the risk of direct exposure of the substrate backside 154 to radiant energy from the heating elements 14 below the holder 100 (FIG. 1). To further reduce this risk, the passages in the substrate holder 100 can have non-linear shapes, wherein it is impossible for radiation to shine through them directly onto the substrate backside 154. For example, the passages can each have a vertical portion and an angled portion.

Simultaneously to the above-described flow of inert gas, reactive process gases are directed generally horizontally above the substrate 16 in the upper reactor chamber 2. The flow of reactive gases results in the deposition of processing materials onto the front side 155 of the substrate 16. The upward flow of inert gas around the edge 17 of the substrate 16 substantially reduces, inhibits, or prevents the downward flow of reactant gas around the substrate edge 17 and into the gap region 152. Thus, the inert gas substantially reduces, inhibits, or prevents deposition of the process gases on the substrate backside. In addition, the support spider 22, holder 100, and substrate 16 are preferably rotated about a central vertical axis during processing. Typically, the gas-conveying tube 144 is rotatable and transmits its rotation to the spider 22, holder 100, and substrate 16. The holder 100 is preferably rotated in a direction in which the angled spacer vanes 124 resist the radially inward flow of reactant gases within the channels 126 between the vanes, as described above. The angled spacer vanes 124 also assist the radially outward flow of inert gas through the channels 126, which further reduces, inhibits, or prevents the inward flow of process gases. Thus, the angled spacer vanes 124 further reduce or prevent backside deposition, even near the substrate edge 17. In this regard, the angling of the vanes 124 has resulted in a tenfold improvement over prior art substrate holders.

It will be understood that the substrate support system 140 reduces or prevents autodoping. As diffused dopant atoms emerge from the backside 154 of the substrate 16, the forced flow of inert gas within the gap region 152 sweeps most of the dopant atoms downward through the passages 118 and 120 into the lower reactor chamber 4. Thus, the diffused dopant atoms are substantially prevented from flowing upward around the substrate edge 17 into the upper reactor chamber 2 and re-depositing on the front side 155 of the substrate 16. Also, if some out-diffused dopant atoms flow radially outward through the ring 110 of spacers and upward around the substrate edge 17, the momentum of the inert gas flowing upward around the edge 17 can blow such dopant atoms away from the substrate front side 155 to be carried away by the general flow of reactant gases and deposition byproducts in the upper reactor chamber 2. The pressure and flow rate of the inert gas injected upward into the region 152 can be adjusted to reduce or minimize the possibility that such dopant atoms will redeposit on the substrate front side 155.

The support system 140 represents a significant improvement over prior art systems because, for example, the hollow support spider 22 permits a controllable, direct forced flow of inert gas into the gap region 152. Based upon the specific design of the substrate holder 100 and spider 22, inert gas can be delivered directly into any number of selected passages 116 at desired locations within the central portion 102 of the holder 100. This system more effectively reduces or prevents backside deposition and autodoping.

With reference to FIG. 1, as mentioned above the dividers 36 of the reactor 10 often do not completely prevent the flow of reactant gases from the upper reactor chamber 2 into the lower chamber 4. In some prior art systems, such reactant gases below the substrate holder can flow to the substrate backside and deposit thereon. However, the substrate support system 140 shown in FIGS. 7 and 8 solves this problem. The forced flow of inert gas into the support spider 22 advantageously results in downward flow of inert gas through the passages 118 and 120 of the holder 100, which substantially inhibits the upward flow of reactant gases to the substrate backside 154. The risk of this mode of backside deposition can also be reduced by maintaining a pressure differential between the upper and lower chambers 2 and 4, wherein the pressure in the latter is kept higher than the pressure in the former. This pressure differential can be produced by introducing some inert gas directly into the lower chamber 4 and reducing the size of, or eliminating altogether, any outlets from the chamber 4. This extra inert gas can be introduced into the chamber 4 by providing an alternative flow path from the gas-conveyor 144 to the chamber 4 (i.e., a flow path through which the inert gas can flow into the chamber 4 without flowing through the gap region 152) or an entirely separate gas inlet.

It will also be understood that the substrate support system 140 can be used to remove the native oxide layer from the backside 154 of the substrate 16. Cleaning gas (e.g., hydrogen gas) can be delivered upward through the gas-conveyor 144, spider 22, and passages 116 into the gap region 152. The cleaning gas removes the oxide layer from the backside 154. The excess cleaning gas and oxide removal byproducts then flow out of the gap region 152 through the passages 118 and 120 and, to some extent, upwardly around the peripheral edge 17 of the substrate 16 (via the channels 126 between the vanes 124; FIG. 1). Oxide layer removal can be conducted simultaneously for the backside 154 and front side 155 of the substrate 16. Thus, the aforementioned substrate backside cleaning operation may involve the simultaneous introduction of a generally horizontal flow of cleaning gas above the substrate 16 in the upper reactor chamber 2. Preferably, the spider 22, holder 100, and substrate 16 are rotated about the central vertical axis during the cleaning operation, which improves uniformity and thoroughness of the oxide layer removal. Again, the angled spacer vanes 124 assist in the radially outward flow of oxide removal byproducts and excess cleaning gas through the channels 126. It has been found that, in some embodiments, nearly complete removal of the oxide layer from the substrate backside 154 can be achieved with a "bake" (i.e., an exposure of the backside 154 to the cleaning gas) of less than two minutes, in some cases between 40-60 seconds.

Skilled artisans will appreciate that other substrate holders can be used in place of the holder 100, particularly those that provide a gap region 152 between the backside of the substrate 16 and an upper surface of the holder. For example, a substrate holder having a different type of spacer element (e.g., spacer lip portions, spacer nubs or pins fixed to the holder surface, an annular lip with a few gas flow grooves, etc.) can be used.

Figure 9:
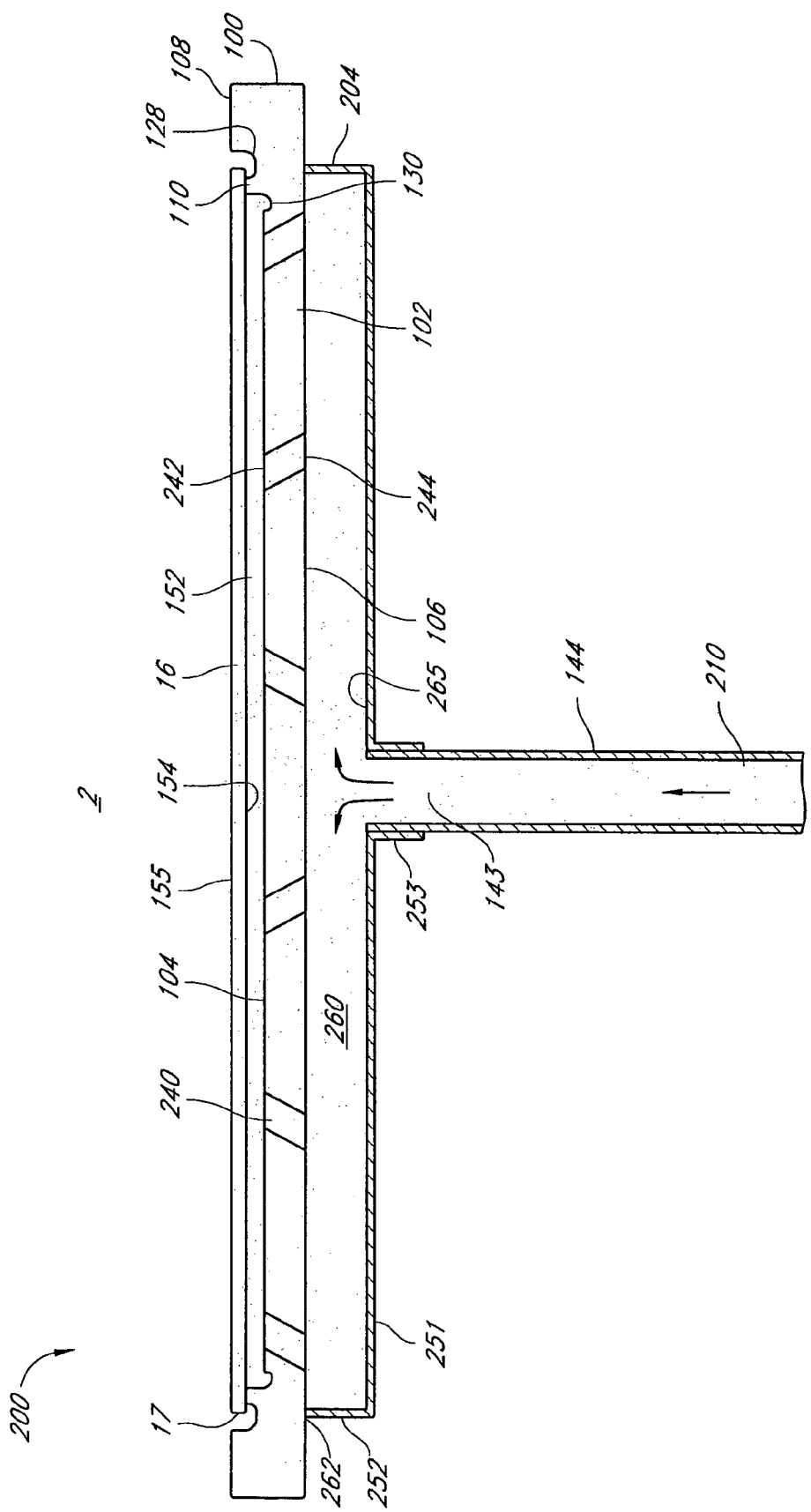
FIG. 9 is a side cross-sectional view of a substrate support system according to a second embodiment of the invention.
Figure 10:
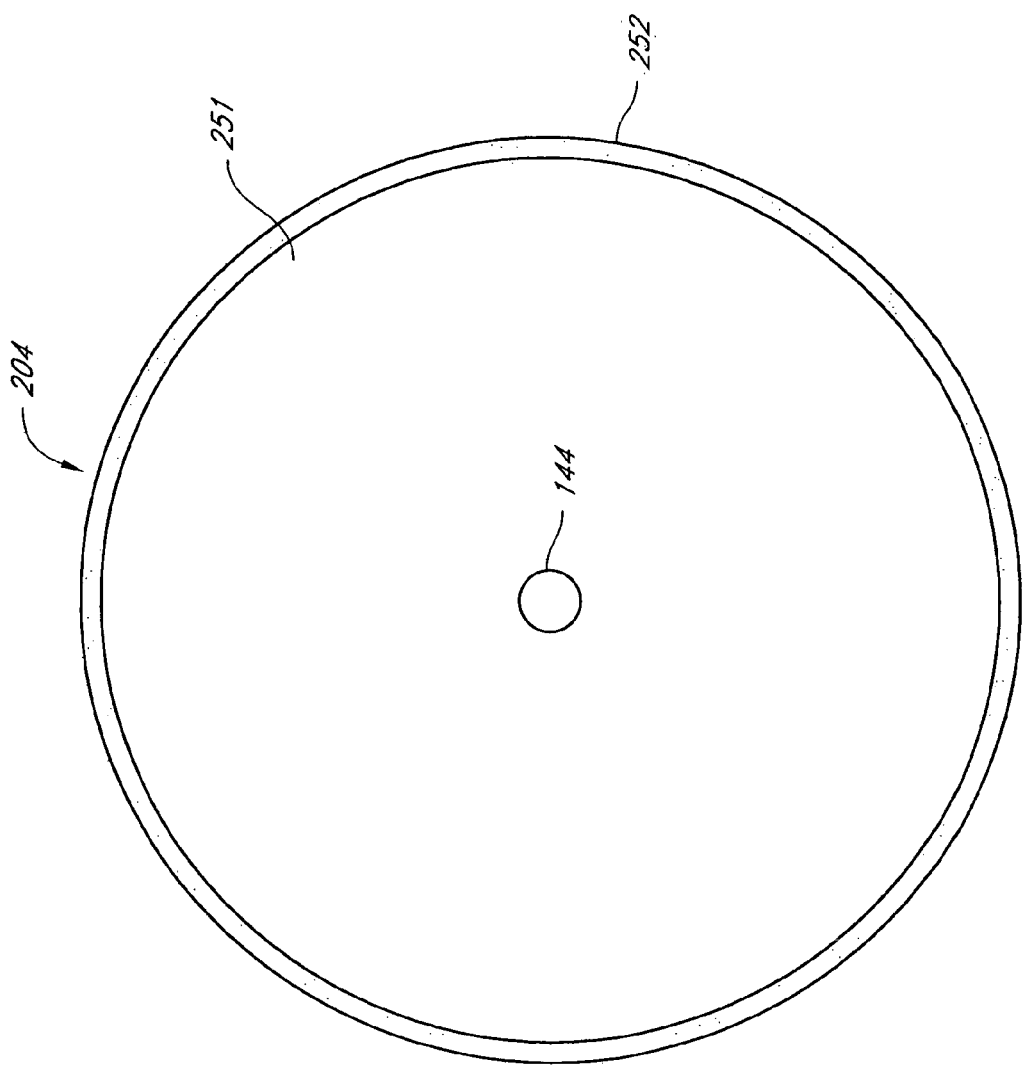
FIG. 10 is a top view of the substrate holder support of the substrate support system of FIG. 9.

FIGS. 9 and 10 illustrate a substrate support system 200 according to another embodiment of the present invention. The system 200 includes a generally bowl- or cup-shaped substrate holder support 204 in place of the support spider 22. FIG. 9 is a side sectional view of the entire system 200, while FIG. 10 is a top view of the holder support 204 alone. The system 200 can support a substrate 16 during substrate processing (e.g., CVD such as epitaxial deposition) or oxide layer removal. Like the above-described system 140, the system 200 prevents or reduces the extent to which process gases contact the backside of the supported substrate 16. The system 200 also reduces or prevents autodoping. Similar to the support spider 22, the substrate holder support 204 may be mounted to a gas-conveyor 144 (e.g., a rotatable vertical tube) and can also engage and support the substrate holder 100. The substrate holder support 204 can rotatably couple the substrate holder 100 to a tube 144, such that the tube, support 204, and holder 100 rotate in unison.

In the illustrated embodiment, the substrate holder support 204 includes a generally flat base 251 that extends from the upper end of the gas-conveying tube 144 to a generally vertical and preferably annular structure 252. Preferably, the structure 252 comprises a wall. The substrate holder 100 can rest, preferably stably, on an upper edge 262 of the vertical wall 252. The upper edge 262 is preferably configured to restrict fluid flow across an interface between the upper edge 262 and the lower surface 106 of the holder 100. The wall 252 defines a relatively large upper opening of the holder support 204, which upper opening preferably underlies at least a majority portion of the bottom surface 106 of the holder 100. This upper opening defines an area whose size is a certain percentage of the size of a substrate 16 that the substrate holder 100 is specifically designed to support. This percentage is preferably within 50-120%, but it could also be within 70-120%, 95-120%, 50-100%, or 70-100%. A chamber 260 is defined between an upper surface 265 of the base 251 and the lower surface 106 of the central portion 102 of the holder 100. The passages 240 of the substrate holder 100 provide fluid communication between the gap region 252 and the chamber 260 defined between the holder 100 and the holder support 204. The holder support 204 can be constructed from materials with suitable characteristics such as quartz, graphite coated with silicon carbide, or other materials. One of ordinary skill in the art can determine the appropriate combination of material type, thickness, and shape to achieve any of the desired goals of this invention, as described herein.

In the illustrated embodiment, the substrate holder 100 is substantially the same as the substrate holder 100 shown in FIGS. 2-8. However, skilled artisans will appreciate that other substrate holders can be used, particularly those that provide a gap region 252 between the backside of the substrate 16 and an upper surface of the holder. For example, a substrate holder having a different type of spacer element (e.g., spacer lip portions, spacer nubs or pins fixed to the holder surface, an annular lip with a few gas flow grooves, etc.) can be used. Skilled artisans will also understand that, for the purposes of this embodiment, the recesses 114 of the holder 100 can be modified or omitted, as there are no spider arms to engage them. Also, in this embodiment, there is no relevant distinction between the above-described passages 116, 118, and 120. Therefore, in this embodiment the passages in the holder 100 are collectively referred to as passages 240 having upper ends 242 and lower ends 244. As in the previously described embodiment, the passages 240 are preferably angled or otherwise configured to minimize direct impingement of gas onto the substrate backside 154.

The substrate holder 100 can be removably or permanently coupled to the substrate holder support 204 which, in turn, is connected to the gas-conveyor 144. Preferably, the substrate holder 100 is stably supported by the substrate holder support 204 so that they rotate in unison substantially without slippage therebetween. For example, the substrate holder 100 can rest upon the substrate holder support 204, so that the substrate holder 100 can be conveniently lifted off of the substrate holder support 204. In other embodiments, the bottom surface of the substrate holder 100 is configured to interlock (e.g., via a snap-connection, pin/hole interlock, or other suitable means) with an upper edge of the holder support 204 to rotationally lock the holder 100 with the holder support 204.

The illustrated substrate holder support 204 comprises a base 251 and an annular vertical wall 252. The base 251 extends from the wall 252 to a flange 253 that engages the gas-conveyor 144. In the illustrated embodiment, the base 251 extends horizontally from the flange 253 and has a shape that is generally similar to the shape of the holder 100. However, the base 251 can have any shape suitable for having a portion of the holder support 204 (e.g., the wall 252) engage the lower surface 106 of the substrate holder 100. The wall 252 of the substrate holder support 204 extends upwardly from the periphery of the base 251. The wall 252 is sized and configured such that it can hold and support the substrate holder 100 with the substrate 16 supported thereon. In the illustrated embodiment, the wall 252 is generally vertically oriented and perpendicular to the base 251. Although not illustrated, the wall 252 can be oriented at any angle with respect to the base 251 and the substrate holder 100 (e.g., conical) depending on, e.g., the desired distance between the base 251 and the lower surface 106 of the substrate holder 100. Additionally, the wall 252 can have any height to achieve the desired distance between the base 251 and the substrate holder support 204.

The illustrated substrate holder support 204 advantageously prevents any direct exposure of the backside 154 of the substrate 16 from the radiant heating elements 14 (FIG. 1) located below the holder 100. In particular, the holder support 204 blocks direct heat energy through the passages 240 of the holder 100. This helps to prevent the existence of hot spots within the substrate 16, which could adversely affect the uniformity of material layers deposited on the substrate.

In the illustrated embodiment, the chamber 260 is generally cylindrical. In one embodiment, the chamber 260 has a generally constant height. In another embodiment, the height of the chamber 260 varies in the radial direction. For example, the height of the chamber 266 can decrease in the radially outward direction. However, the chamber 260 can have any desired and suitable height profile. In the illustrated embodiment, the base 251 and wall 252 have a generally U-shaped cross sectional profile. This profile can alternatively be V-shaped, W-shaped, semicircular, combinations thereof, or any other suitable shape.

The size and configuration of the base 251 and wall 252 can be varied in order to obtain a desired size and configuration of the chamber 260. In the illustrated embodiment, for example, the substrate holder support 204 is generally bowl- or cup-shaped such that the chamber 260 is generally cylindrical with a substantially uniform height equal to the height of the wall 252. The diameter of the base 251 can be selected depending on the desired location of the edge or upper portion 262 of the wall 252. In the illustrated embodiment (FIG. 9), the base 251 is sized so that the wall 252 is located radially outward of all of the passages 240.

The substrate holder support 204 can be mounted to the upper end or outlet 143 of the gas-conveyor 144. In one embodiment, the gas-conveyor 144 is a hollow tubular member that provides fluid (e.g., cleaning gas and/or inert gas) to the substrate holder support 204. The tube 144 includes a tube passage 210 that extends through the tube 144 to the chamber 260. The gas-conveyor 144 can preferably be rotated to simultaneously rotate the holder support 204, holder 100, and substrate 16. Optionally, the gas-conveyor 144 can be moved in a vertical direction to move upward and/or downward the holder 100, holder support 204, and substrate 16. It will be understood that the gas-conveyor 144 can move the holder 100 and the holder support 204 when the substrate 16 is not loaded onto the substrate support system 200.

In the illustrated embodiment, the relatively small passages 240 permit fluid communication between the gap region 152 and the chamber 260. That is, gas can migrate between the gap region 152 and the chamber 260 via the passages 240. In other embodiments, such fluid communication can be effected by other types of passages, such as slotted rings or a single large hole in the central portion 102 of the holder 100.

The substrate holder 100 and the substrate holder support 204 can be made from materials that have similar or different coefficients of thermal expansion. In one embodiment, the holder 100 and the holder support 204 have similar coefficients of thermal expansion to reduce relative movement between the lower surface 106 of the holder 100 and the upper portion 262 of the wall 252.

In one embodiment, frictional engagement between the upper portion 262 of the wall 252 of the holder support 204 and the lower surface 106 of the holder 100 maintains the position of holder 100 relative to the holder support 204. Preferably, the holder 100 is centered about the axis of rotation of the gas-conveyor 144. Optionally, the holder 100 can have a means for centering itself relative to the holder support 204. For example, the lower surface 106 can have ridges or grooves configured to engage with the upper portion 262 to ensure that the holder 100 remains in or moves to a desired position relative to the holder support 204. At least one of the upper portion 262 and lower surface 106 can have protuberances, splines, grooves, roughened surfaces, or other surface features for preventing slippage between the holder 100 and the holder support 204, particularly during rotation of the holder 100 and holder support 204. Optionally, a seal can be formed between the upper portion 262 and the lower surface 106 to maintain the integrity of the chamber 260. For example, the seal can inhibit or prevent processing gases in the lower reactor chamber 4 from entering into the chamber 260.

In the illustrated embodiment, the substrate holder 100, substrate holder support 204, and gas-conveyor 144 are configured to inhibit backside deposition as follows. During substrate processing, an inert gas is directed upward through the gas-conveyor 144 into the chamber 260. The inert gas flows throughout and fills the chamber 260. Some of the inert gas flows through the passages 240 into the gap region 152. The inert gas within the gap region 152 forms a "gas curtain" that inhibits or prevents process gases in the upper reactor chamber 2 above the substrate 16 from effusing around the substrate edge 17 to the gap region 152. Specifically, the inert gas within the gap region 152, due to an at least slightly elevated pressure compared to the process gas pressure in the chamber 2 above the substrate 16, tends to flow upward between the substrate holder 100 and the substrate 16 around the substrate edge 17. In the illustrated embodiment, the inert gas exits the gap region 152 by flowing radially outward through the channels 126 between the spacer vanes 124 (FIGS. 5, 6) and then upward around the substrate edge 17, as described above in connection with the embodiment of FIGS. 2-8. Also, as described above, the angled spacer vanes 124 encourage the radially outward flow of the inert gas within the channels 126, which substantially inhibits or prevents radially inward flow of gases (reactant gases or inert gas) therebetween.

If the pressure within the gap region 152 is too high, the substrate 16 may undesirably lift and/or slide with respect to the substrate holder 100. If the pressure within the gap region 152 is too low, reactant gases above the substrate 16 may effuse around the substrate edge 17 into the gap region 152. The pressure of the inert gas within the gap region 152 is preferably either slightly or substantially greater than the pressure of the reactant gases within the upper reactor chamber 2, but not so great as to cause the substrate 16 to lift and/or slide with respect to the substrate holder 100. In selecting the gas pressure inside the gap region 152, the goal is to substantially prevent or reduce the flow of reactant gas from the chamber 2 around the substrate edge 17 into the gap region 152, without introducing a substantial risk of substrate cooling (localized or otherwise) or substrate lift or slide. Skilled artisans will be able to determine the appropriate gas pressure within the gap region 152 based upon these considerations. In one embodiment, it is contemplated that the inert gas flowing into the chamber 260 will ordinarily be provided at a relatively low flow rate of 0.4-2.0 slm. In a preferred implementation, little or no reactant gas within the chamber 2 flows into the gap region 152 during substrate processing.

In comparison to the gas-conveying spider 22 discussed above, which directs the inert gas directly into the passages 116 (FIGS. 2, 3, 8) of the substrate holder 100, the substrate holder support 204 advantageously reduces localized cooling of the substrate 16. This is because the gas-conveying spider 22 directs jets of the inert gas directly onto specific locations of the substrate backside 154, while the holder support 204 does not. The holder support 204 tends to permit the inert gas to migrate more slowly through the passages 240, such that the gas does not impinge the substrate backside 154 with as much momentum.

With reference to FIG. 1, as mentioned above the dividers 36 of the reactor 10 often do not completely prevent the flow of reactant gases from the upper reactor chamber 2 into the lower chamber 4. In some prior art systems, such reactant gases below the substrate holder can flow to the substrate backside and deposit thereon. However, the substrate support system 200 shown in FIGS. 9 and 10 solves this problem. Advantageously, the substrate holder support 204 substantially inhibits or prevents such reactant gases in the chamber 4 from passing through the passages 240 into the gap region 152. In particular, the base 251 and annular wall 252 inhibit the flow of these reactant gases into the chamber 260. Optionally, the inert gas in the chamber 260 can be pressurized sufficiently to prevent or inhibit reactant gases within the lower chamber 4 from effusing between the upper portion 262 of the wall 252 and the substrate holder's lower surface 106 into the chamber 260. For example, the inert gas pressure in the chamber 260 can be maintained at least equal to or slightly higher than the gas pressure in the lower chamber 4. Also, the system 200 can alternatively be used in a reactor 10 that does not have dividers 36 separating the upper and lower chambers 2 and 4. Omitting the dividers 36 can reduce cost and complexity and can avoid some processing problems, such as devitrification and unwanted coating on the quartz dividers 36.

The substrate support system 200 also facilitates the removal of a native oxide layer from the substrate backside 154. The oxide layer can be removed from the substrate backside 154 by injecting a cleaning gas (such as $H_2$) upward through the gas-conveyor 144. Excess cleaning gas and oxide removal byproducts can exit the system 200 by flowing upward around the substrate edge 17 into the upper reactor chamber 2. Rotation of the substrate holder 100 can assist in such flow of the cleaning gas and oxide removal byproducts. Typically, additional cleaning gas is concurrently provided above the substrate 16 in the upper chamber 2 to simultaneously remove an oxide layer from the front side 155 of the substrate 16.

The inert gas flowing through the substrate support system 200 is preferably silicon-free inert gas, such as hydrogen gas. It will be understood that hydrogen gas can act as an inert purge or sweep gas as well as a cleaning gas. When there is no oxide layer on a silicon wafer 16, and under certain temperature conditions, the hydrogen gas is inert. When there is an oxide layer ($SiO_2$) on the silicon wafer 16, the hydrogen gas chemically reduces the oxide layer to remove the oxygen and leave the silicon on the wafer surface. In one embodiment, the inert gas is almost entirely hydrogen. However, other gas or gases can flow through the substrate support system 200.

The pressure and flow rate of gas flowing through the gas-conveyor 144 into the chamber 260 and the gap region 152 can be adjusted based on the size and configuration of the substrate 16, substrate holder 100, and holder support 204. The pressure and flow rate of the gas can also be adjusted based upon the flow parameters and characteristics of gas within the lower reactor chamber 4. This will of course depend upon whether any of the passages 240 have lower ends 244 located radially outward of the annular wall 252 (e.g., FIG. 11, discussed below) of the holder support 204.

Figure 11:
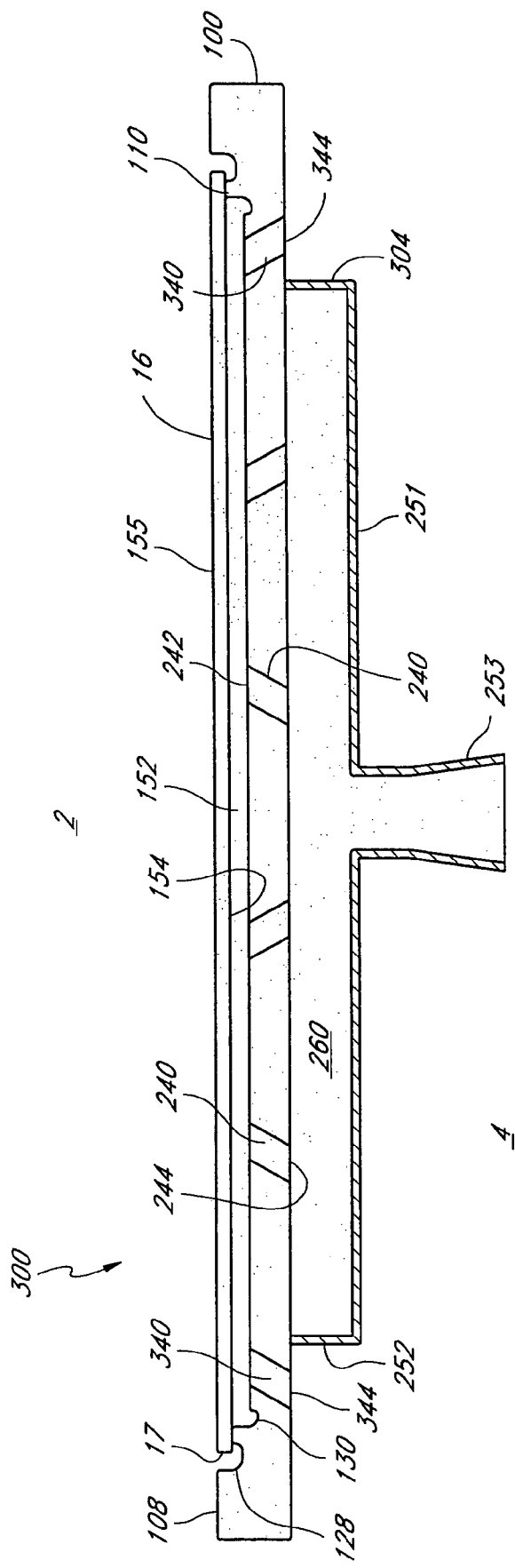
FIG. 11 is a side cross-sectional view of a substrate support system according to a third embodiment of the invention.

FIG. 11 illustrates a substrate support system 300 according to another embodiment of the present invention. Many of the components of the system 300 are similar to the substrate support system 200 described above and will therefore not be discussed in detail. As discussed below, the substrate support system 300 more effectively reduces autodoping while still significantly preventing or reducing the extent of substrate backside deposition.

The substrate support system 300 includes a substrate holder support 304 sized and configured to support the substrate holder 100. As described above, the holder support 304 includes a flange 253 configured to attach to an upper end or inlet of a gas-conveyor (e.g., a rotatable vertical tube). The holder support 304 is sized so that a lower opening 344 of at least one passage 340 is located such that gas emerging downward from the opening 344 does not flow into the chamber 260. In the illustrated embodiment, the opening 344 is located radially outward of the annular wall 252, which is preferably generally circular. Preferably, at least one full set or ring of lower openings 344 of passages 240 is located such that gas emerging from the openings 344 does not flow into the chamber 260 (e.g., the openings 344 are all radially outward of the annular wall 252). Optionally, lower openings 344 of multiple rings of passages 340 are located radially outward of the annular wall 252. Preferably, this at least one outermost set or ring of passages 340 is positioned substantially evenly throughout the peripheral region of the substrate holder 100. During substrate processing, inert gas flowing downward through the at least one set or ring of passages 340 sweeps most or substantially all of the diffused dopant atoms out of the gap region 152 to the reactor lower chamber 4 below the substrate holder 100, as discussed below. The passages 340 located radially outward of the substrate holder support 304 can alternatively be unevenly spaced about the periphery of the base plate 251. In the following description, the reference numeral 240 refers to passages whose lower ends or openings 244 are located so as to discharge gas into the holder support 304, and the reference numeral 340 refers to passages whose lower ends or openings 344 are located so as to discharge gas to the chamber 4 outside of the holder support 304.

In operation, an inert gas can be fed through a gas-conveyor into the flange inlet 253. The inert gas flows upward into the chamber 260 defined between the substrate holder support 304 and the substrate holder 100. The inert gas then flows through the passages 240 into the gap region 152 above the substrate holder 100. The inert gas flows throughout and substantially fills the gap region 152. A substantial portion of the inert gas in the gap region 152 flows downward through the passages 340 into the lower reactor chamber 4. Thus, the gap region 152 is in fluid communication with both the chamber 4 and the chamber 260. The number and locations of the passages 340 can be determined based on the desired flow parameters of the inert gas within the gap region 152 and/or the chamber 4. Advantageously, dopant atoms that diffuse through the substrate 16 and emerge from the substrate backside 154 are substantially swept out of the gap region 152 by the flow of inert gas downward through the passages 340 into the chamber 4. This substantially prevents or reduces the amount of autodoping on the upper surface of the substrate 16. The inert gas pressure within the gap region 152 is preferably slightly or substantially higher than the pressure within the chamber 4 to create a forced flow of inert gas through the passages 340 and into the chamber 4. In a preferred implementation, little or no gas within the chamber 4 passes through the passages 340 into the gap region 152.

With continued reference to FIG. 11, some of the inert gas in the gap region 152 may flow radially outward through the ring 110 of spacer vanes 124 (FIGS. 5, 6) and upward around the substrate edge 17. This portion of the inert gas may sweep some of the diffused dopant atoms upward into the upper reactor chamber 2, which introduces a risk of autodoping. This autodoping risk can be reduced by adjusting the size of the passages 340 relative to the size of the channels 126 (FIGS. 5, 6) within the vanes 124. If the sum of the smallest cross-sections of each of the passages 340 is greater than the sum of the smallest cross-sections of each of the channels 126, then the inert gas will tend to "prefer" exiting the gap region 152 through the passages 340 rather than the through the channels 126. In other words, the risk of autodoping is reduced if the passages 340 collectively represent a wider flow path (i.e., greater cross-sectional flow area) than the channels 126. Skilled artisans will understand that the autodoping risk becomes further reduced as the disparity between the flow path widths of the passages 340 and channels 126 increases.

As mentioned above, the ring 110 of spacer vanes 124 can optionally be replaced with a solid substrate support ledge. In choosing between these two options, skilled artisans can balance the need for reduced autodoping against the need for temperature uniformity in the wafer. A solid support ledge provides greater resistance against autodoping because it blocks the flow of dopant atoms that would otherwise effuse around the substrate edge 17. Spacer vanes 124 minimize heat conduction between the substrate holder and the substrate 16, thus improving temperature uniformity. It should be noted that even when vanes 124 are used, autodoping can be suitably reduced by increasing the forced flow rate of inert gas through the system. It will also be appreciated that, in certain implementations, a solid substrate support ledge can better inhibit backside deposition.

With continued reference to FIG. 11, the risk of autodoping can also be reduced by suitably controlling the pressures in the regions 152, 2, and 4. Preferably, the inert gas pressure in the gap region 152 is greater than the pressures in the upper reactor chamber 2 and lower reactor chamber 4. If it were not, the inert gas would not flow into the chambers 2 and 4. Optionally, the pressure in the upper chamber 2 can be maintained slightly or substantially higher than the pressure in the lower chamber 4, so that the inert gas in the gap region 152 prefers flowing through the passages 340 rather than through the ring 110 of spacer vanes 124 (FIGS. 5, 6).

Of course, the objective of having most of the inert gas exit the gap region through the passages 340 is preferably suitably balanced against the possible objective of having some of the inert gas flow through the ring 110 of spacer vanes 124 to prevent backside deposition of reactant gases from the upper chamber 2. In adjusting the size of the passages 140 and channels 126 and the pressures of the regions 152, 2, and 4, skilled artisans will be able to suitably balance these goals in the implementing the substrate support system 300.

The substrate support system 300 of FIG. 11 can also substantially prevent backside deposition by sweeping reactant gases downward through the passages 340. Reactant gases from the upper reactor chamber 2 may effuse downward between the substrate edge 17 and the shoulder 108 of the substrate holder 100, particularly if the inert gas in the gap region 152 does not flow radially outward through the ring 110 of vanes 124 (FIGS. 5, 6). If such reactant gases flow radially inward through the channels 126 between the vanes 124, the forced flow of inert gas preferably sweeps substantially all of the reactant gas downward through the passages 340 into the lower reactor chamber 4. In this manner, the system 300 substantially prevents or reduces the extent to which the effused reactant gases may deposit on the backside 154 of the substrate 16. Preferably, at least one ring or set of passages 340 is positioned very close to the thermal isolation groove 130, to minimize the peripheral area of the substrate backside 154 on which the reactant gases may become deposited. Preferably, the outermost ring or set of passages 340 is positioned such that any backside-deposited reactant gases deposit only within the exclusion zone of the substrate 16.

In one embodiment, the substrate support system 300 is configured so that there is only one passage 340 having a lower opening 344 positioned so that gas emerging downward from the opening 344 flows into the lower reactor chamber 4 outside of the substrate holder support 304. With reference to FIG. 11, there is preferably only one passage 340 having a lower end 344 that is radially outside of the annular wall 252. In a preferred implementation, the inert gas flowing downward through the single passage 340 sweeps most or substantially all of the out-diffused dopant atoms out of the gap region 152 to the lower chamber 4. Since there is only one passage 340 in the system 300, it may be preferable to inject the inert gas into the holder support 304 at a more elevated pressure (compared to the inert gas pressure of the system 200 shown in FIGS. 9 and 10) in order to more effectively sweep dopant atoms and/or downwardly effused reactant gases into the single passage 340. It may also be preferable to increase the size of the single passage 340 to some degree. Advantageously, this embodiment with only one passage 340 results in greater inert gas flow upward around the substrate edge 17, thereby more effectively preventing or reducing backside deposition of reactant gases.

It will be understood that the substrate support system 300 can also be used to remove an oxide layer from the substrate backside 154 by injecting a cleaning gas upward into the flange inlet 253 of the substrate holder support 204. The cleaning gas flows upward through the chamber 260 and passages 240 to remove the oxide layer from the backside 154. The excess cleaning gas and oxide removal byproducts exit the system 300 by flowing downward through the passages 340 into the lower chamber 4 and/or radially outward through the ring 110 of spacer vanes 124 into the upper chamber 2. A cleaning gas can also simultaneously be introduced into the chamber 2 to remove an oxide layer from the front side 155 of the substrate 16.

With regard to the above-described embodiments 200 (FIGS. 9 and 10) and 300 (FIG. 11), the substrate holder support 204, 304 can be configured to convey gas upward into lower ends of any number of passages within the substrate holder 100. Preferably, this number is at least 9, but it can also be within 9-250, 6-225, 20-250, 50-200, 100-200, or 100-250.

Described above are three different general embodiments of substrate support systems: (1) the system 140 (FIGS. 7 and 8) involving the hollow support spider 22; (2) the system 200 (FIGS. 9 and 10) involving the substrate holder support 204 in which all of the passages 240 of the substrate holder 100 are in fluid communication with the chamber 260 defined between the holder 100 and holder support 204; and (3) the system 300 (FIG. 11) involving a substrate holder support 304 in which one or more passages 340 of the holder 100 are positioned to discharge gas downwardly into the lower reactor chamber 4 outside of the chamber 260. Skilled artisans will appreciate from the teachings herein that these embodiments provide somewhat different advantages relative to one another. The system 140 is expected to be the most effective against autodoping because there are relatively more passages 118 and 120 through which out-diffused dopant atoms can be swept downwardly into the lower chamber 4. The system 200 is expected to be the most effective against backside deposition because the only exit flow path for inert gas injected into the holder support 204 is radially outward through the ring 110 of spacer vanes 124, which provides for better inhibition of reactant gas flow downward around the substrate edge 17. Also, the base 251 of the holder support 204 covers the lower ends 244 of all of the passages 240 of the holder 100, thereby preventing reactant gases in the lower reactor chamber 4 from flowing upward through such passages to the substrate backside 154.

Compared to the substrate support systems 140 and 200, the substrate support system 300 may, in some implementations, more effectively balance the dual aims of inhibiting backside deposition and autodoping. Compared to the system 140, the system 300 is expected to more effectively inhibit backside deposition because (1) due to the fact that there are fewer passages in the holder 100 through which inert gas in the gap region 152 can flow downward into the lower reactor chamber 4, the inert gas is more likely to flow upward around the substrate edge 17 and inhibit the downward flow of reactant gases around the edge 17; and (2) the base 251 of the holder support 304 substantially prevents reactant gases in the chamber 4 from flowing upward into passages of the holder 100 to the substrate backside 154. Compared to the system 200, the system 300 is expected to more effectively inhibit autodoping because there is at least one passage 340 through which dopant atoms can be swept downward into the chamber 4.

The methods described and illustrated herein are not limited to the exact sequences of steps described. Nor are they necessarily limited to the practice of all the steps set forth. Other sequences of steps or events, or less than all of the steps, or simultaneous occurrences of the steps, may be utilized in practicing the embodiments and methods of the invention.

Furthermore, the skilled artisan will recognize the interchangeability of various features from different embodiments. Similarly, the various features and steps discussed above, as well as other known equivalents for each such feature or step, can be mixed and matched by one of ordinary skill in this art to perform methods in accordance with principles described herein.

Although the invention has been disclosed in the context of certain embodiments and examples, it will be understood by those skilled in the art that the invention extends beyond the specifically disclosed embodiments to other alternative embodiments and/or uses and obvious modifications and equivalents thereof. Accordingly, the invention is not intended to be limited by the specific disclosures of preferred embodiments herein.

What is claimed is:

1. A substrate support system comprising:
    a substrate holder for holding a substrate, the substrate holder comprising:
    a central portion having an upper surface, a lower surface, and first and second sets of open passages extending from the upper surface to the lower surface wherein at least some of the first and second sets of open passages have an orientation that is non-parallel with the upper surface of the central portion of the substrate holder; and
    at least one spacer extending upward from the central portion and having an upper support surface raised above the upper surface of the central portion, the at least one spacer's upper support surface being configured to support a peripheral portion of the substrate so that a gap region exists between the upper surface of the central portion and a bottom surface of the substrate; and a hollow support member having an inlet adapted to engage an outlet of a gas-conveyor to facilitate gas flow from the gas-conveyor into the hollow support member, the hollow support member having one or more upper open ends adapted to support the lower surface of the central portion of the substrate holder, the one or more upper open ends configured to convey gas upward into lower ends of the first set of passages in the central portion of the substrate holder, with upper ends of the first set of passages being configured to convey gas to the gap region, wherein the second set of passages is configured to convey gas from the gap region to the lower surface of the substrate holder without conveying gas into the hollow support member; and wherein the second set of passages comprises first and second subsets of passages, the passages of the first subset being radially inward of the first set of passages, the passages of the second subset of passages being radially outward of the first set of passages, each of the passages of the first subset having an upper end that is radially outward of a lower end of the passage, each of the passages of the second subset having an upper end that is radially inward of a lower end of the passage.

2. The substrate support system of claim 1, wherein the upper surface of the central portion of the substrate holder is concave.

3. The substrate support system of claim 1, wherein the upper surface of the central portion of the substrate holder is generally flat.

4. The substrate support system of claim 1, wherein the at least one spacer comprises a plurality of spacers that collectively encircle the central portion of the substrate holder.

5. The substrate support system of claim 1, wherein the substrate holder comprises a susceptor.

6. The substrate support system of claim 1, wherein the gas-conveyor comprises a substantially vertical hollow tube, the outlet of the gas-conveyor comprising an open upper end of the tube.

7. The substrate support system of claim 1, wherein the gap region has a substantially uniform height.

8. The substrate support system of claim 1, wherein the inlet of the hollow support member is configured to engage the outlet of the gas-conveyor such that rotation of the gas-conveyor about a vertical axis causes the hollow support member and substrate holder to rotate with the gas-conveyor.

9. The substrate support system of claim 1, wherein the at least one spacer comprises a ring of vanes spaced apart and generally parallel to one another, each of the vanes being angled with respect to a center of the ring of vanes.

10. The substrate support system of claim 9, wherein the vanes are straight.

11. The substrate support system of claim 9, wherein the vanes are curved.

12. The substrate support system of claim 1, wherein the at least one spacer comprises a plurality of spacers, and wherein when the spacers' upper support surfaces support the peripheral portion of the substrate, rotation of the hollow support member and substrate holder in a first rotational direction about a vertical center axis causes the spacers to substantially resist radially inward gas flow between the spacers, and rotation of the hollow support member and substrate holder in a second rotational direction about the vertical center axis causes the spacers to substantially resist radially outward gas flow between the spacers, the second rotational direction being opposite the first rotational direction.

13. The substrate support system of claim 1, wherein the hollow support member comprises a hollow body and a plurality of tubes extending generally radially outward and upward from the hollow body, the inlet of the hollow support member being located generally on a lower surface or end of the hollow body, the one or more upper open ends of the hollow support member comprising upper ends of the tubes.

14. The substrate support system of claim 13, wherein the plurality of tubes consists of three tubes.

15. The substrate support system of claim 13, wherein each of the upper ends of the tubes is configured to be received within a corresponding recess in the lower surface of the central portion of the substrate holder, the corresponding recess including a lower end of at least one of the passages of the central portion of the substrate holder.

16. The substrate support system of claim 13, wherein each of the tubes consists of a single rigid tube.

17. The substrate support system of claim 1, wherein the one or more upper open ends of the hollow support member consists of one open end defined by an annular wall with an upper edge configured to stably support the substrate holder.

18. The substrate support system of claim 17, wherein the hollow support member comprises a generally horizontal base member and the annular wall, the annular wall extending upward from the base member.

19. The substrate support system of claim 17, wherein the one open end supplies gas to lower ends of at least 9 of the passages.

20. The substrate support system of claim 17, wherein at least one of the lower ends of the passages is located radially outside of the annular wall.

21. The substrate support system of claim 1, wherein the substrate holder further comprises an annular shoulder encircling the at least one spacer.

22. The substrate support system of claim 1, wherein the first and second sets of passages consist of 9 to 250 passages.

23. The substrate support system of claim 1, wherein the lower surface of the central portion of the substrate holder has a density of passages of 0.01 to 3.0 passages per $cm^2$.

24. The substrate support system of claim 1, further comprising the gas-conveyor.

25. The substrate support system of claim 1, wherein the inlet of the hollow support member is adapted to engage the outlet of the gas-conveyor in a substantially fluid-tight manner, the one or more upper open ends of the hollow support member adapted to convey gas upward into one or more of the passages of the central portion of the substrate holder in a substantially fluid-tight manner.

26. The substrate support system of claim 1, wherein one or more of the passages are oriented at an angle with respect to vertical.

27. The substrate support system of claim 1, wherein each of the passages has an upper end at the upper surface of the central portion and a lower end at the lower surface of the central portion, the entire length of each passage between its upper and lower ends extending through an integrally formed portion of the central portion of the substrate holder.

28. The substrate support system of claim 1, wherein each of the passages includes only one end at the upper surface of the central portion and only one end at the lower surface of the central portion, and wherein each of the passages is not connected to any of the other passages inside the substrate holder.

29. The substrate support system of claim 1, wherein the one or more upper open ends of the hollow support member are adapted to directly support the lower surface of the central portion of the substrate holder.

30. The substrate support of claim 1, wherein the at least one spacer comprises a spacer having a generally annular shape.

* * * * *

UNITED STATES PATENT AND TRADEMARK OFFICE
CERTIFICATE OF CORRECTION

PATENT NO. : 7,648,579 B2
APPLICATION NO. : 11/057111
DATED : January 19, 2010
INVENTOR(S) : Goodman et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 204 days.

Signed and Sealed this

Twenty-third Day of November, 2010

David J. Kappos
*Director of the United States Patent and Trademark Office*